United States Patent
Behera et al.

(10) Patent No.: US 8,310,309 B2
(45) Date of Patent: Nov. 13, 2012

(54) NOISE-CANCELING FOR DIFFERENTIAL AMPLIFIERS REQUIRING NO EXTERNAL MATCHING

(75) Inventors: Manas Behera, Austin, TX (US); Harish S Muthali, Round Rock, TX (US); Kenneth Charles Barnett, Austin, TX (US)

(73) Assignee: QUALCOMM, Incorporated, San Diego, CA (US)

( * ) Notice: Subject to any disclaimer, the term of this patent is extended or adjusted under 35 U.S.C. 154(b) by 87 days.

(21) Appl. No.: 12/772,924

(22) Filed: May 3, 2010

(65) Prior Publication Data

US 2011/0267144 A1    Nov. 3, 2011

(51) Int. Cl.
H03F 3/45        (2006.01)
(52) U.S. Cl. ........................................ 330/260; 330/255
(58) Field of Classification Search .................. 330/253, 330/255, 260, 261
See application file for complete search history.

(56) References Cited

U.S. PATENT DOCUMENTS

| | | | |
|---|---|---|---|
| 4,135,120 A * | 1/1979 | Hoshimi et al. | 318/400.04 |
| 5,191,297 A | 3/1993 | Penman et al. | |
| 5,959,475 A * | 9/1999 | Zomorrodi | 327/112 |
| 6,002,860 A | 12/1999 | Voinigescu et al. | |
| 7,760,022 B2 * | 7/2010 | Yamada | 330/255 |
| 7,978,010 B2 * | 7/2011 | Lee | 330/255 |
| 2003/0112064 A1 | 6/2003 | Masuda et al. | |
| 2004/0017252 A1 | 1/2004 | Miyazaki | |
| 2007/0024377 A1 | 2/2007 | Wang et al. | |
| 2007/0103235 A1 | 5/2007 | Heck | |
| 2007/0216482 A1 | 9/2007 | Hollenbeck et al. | |
| 2007/0253128 A1 | 11/2007 | Tiebout et al. | |
| 2010/0291881 A1 | 11/2010 | Brunn et al. | |

FOREIGN PATENT DOCUMENTS

DE    102007040063 A1    2/2009

OTHER PUBLICATIONS

Bruccoleri F et al: "Wide-Band CMOS Low-Noise Amplifier Exploiting Thermal Noise Canceling", IEEE Journal of Solid-State Circuits, IEEE Service Center, Piscataway, NJ, USA, vol. 39, No. 2, Feb. 1, 2004, pp. 275-282, XP011106496, ISSN: 0018-9200, DOI: DOL10.1109/JSSC.2003.821786.
Chen, et al., "A highly Linear Broadband CMOS LNA Emplying Noise and Distortion Cancellation," IEEE Journal of Solid State Circuits, vol. 43, No. 5 pp. 1164-1176, May 2008.
Chih-Fan Liao et al: "A Broadband Noise-Canceling CMOS LNA for 3.1-10.6-GHz UWB Receivers", IEEE Journal of Solid-State Circuits, IEEE Service Center, Piscataway, NJ, USA, vol. 42, No. 2, Feb. 1, 2007, pp. 329-339, XP011161672, ISSN: 0018-9200, DOI: DOI:10.1109/JSSC.2006.889356.
International Search Report and Written Opinion—PCT/US2011/035067—ISA/EPO—Nov. 25, 2011.

* cited by examiner

*Primary Examiner* — Henry Choe
(74) *Attorney, Agent, or Firm* — Ramin Mobarhan

(57) ABSTRACT

A differential Low Noise Amplifier (LNA) includes a first stage of resistive feedback amplifiers and second stage of complementary amplifiers, where the outputs of the first stage are coupled to the inputs of the second stage in a cross-coupled fashion. An inductive load, such as a transformer, combines signals output from the complementary amplifiers of the second stage. In one example, the LNA has an input impedance of less than 75 ohms, a noise factor of less than 2 dB, and a gain of more than 20 dB. Due to the low input impedance, the LNA is usable to amplify a signal received from a source having a similar low impedance without the use of an impedance matching network between the output of the source and the input of the LNA.

21 Claims, 9 Drawing Sheets

LNA WITH RESISTIVE FEEDBACK INPUT STAGE AND
SOURCE FOLLOWER OUTPUT STAGE
SINGLE-ENDED EXAMPLE

LNA WITH RESISTIVE FEEDBACK INPUT STAGE AND
SOURCE FOLLOWER OUTPUT STAGE
SINGLE-ENDED EXAMPLE

LNA WITH COMMON-GATE INPUT STAGE AND TWO
COMMON SOURCE OUTPUT STAGES
SINGLE-ENDED EXAMPLE

LNA WITH COMMON-GATE INPUT STAGE AND
COMPLEMENTARY OUTPUT STAGE
SINGLE-ENDED EXAMPLE

| TYPE | INPUT STAGE | OUTPUT STAGE | INPUT IMPEDANCE | NOISE FACTOR | GAIN |
|---|---|---|---|---|---|
| TYPE #1 LNA | COMMON GATE | COMPLEMENTARY | HIGH (BAD) | BAD | GOOD |
| TYPE #2 LNA | RESISTIVE FEEDBACK | SOURCE FOLLOWER | LOW (GOOD) | GOOD | BAD |
| SPECIFIC EMBODIMENT OF FIG. 10 | RESISTIVE FEEDBACK | COMPLEMENTARY | LOW (GOOD) | GOOD | GOOD |

RF=400 OHMS

RF=400 OHMS

S11 REFLECTION COEFFICIENT, RF=400 OHMS

NOISE-CANCELING FOR DIFFERENTIAL AMPLIFIERS REQUIRING NO EXTERNAL MATCHING

BACKGROUND INFORMATION

1. Technical Field

The disclosed embodiments relate to differential amplifiers, and more particularly to high performance differential amplifiers that can be coupled to low impedance sources without intervening matching networks.

2. Background Information

The first stage in a receiver is often an amplifier referred to as a Low-Noise Amplifier or "LNA". FIG. 1 (Prior Art) is a simplified block diagram of a device that employs such an LNA. The device is a mobile communication device (for example, a cellular telephone handset) and includes an antenna 1, an analog Radio Frequency (RF) transceiver integrated circuit 2, a digital baseband processor integrated circuit 3, a duplexer 4, a power amplifier 5, and a number of matching networks 6-9. A processor 10 in the digital baseband processor integrated circuit 3 controls the RF transceiver 2 by sending control communications to a receive chain 11 and to a transmit chain 12 of the RF transceiver integrated circuit 2 via a serial bus 13. The first stage of the receive chain 11 is the LNA 14.

FIG. 2 (Prior Art) is a more detailed diagram of the portion of the circuit of FIG. 1 between antenna 1 and LNA 14. The LNA in this example is a differential LNA. LNA 14 receives a differential signal via terminals 15 and 16. Dashed line 17 represents the boundary of integrated circuit 2. LNA 14 outputs a differential signal to a differential quadrature mixer circuit 18. The receiver is tuned by setting the frequency of a local oscillator signal LO1 output by a local oscillator 19. The signal input path to the terminals 15 and 16 includes antenna 1, matching network 6, duplexer 4, a bandpass filter (BPF) 20, a balun 21, and matching network 7. Providing the additional components of matching network 7 generally adds cost to the manufacturing cost of the overall device. It would be desirable not to have to provide such a matching network, but it is unfortunately often necessary. It is difficult to realize an LNA that has low noise (noise factor <2 dB), high gain (>20 dB), and an input impedance of fifty ohms. The input impedance at operational frequencies looking into the conventional LNA 14 of FIG. 2 is substantially higher than fifty ohms and may be one hundred ohms or more. The impedance of antenna 1, on the other hand, is approximately fifty ohms.

FIGS. 3-6 (Prior Art) are diagrams of several conventional types of LNAs. Although single-ended examples of the topologies are presented for ease of illustration and explanation, the topologies are extendable to differential circuits.

FIG. 3 (Prior Art) is a diagram of an LNA having a resistive feedback amplifier based input stage and a source follower based output stage. Transistors $M_{1a}$ and $M_{1b}$ and resistor R form the input stage. Transistors $M_{2a}$ and $M_{2b}$ and $M_3$ form the output stage. IN denotes the input node. OUT denotes the output node. For additional information on this LNA circuit, see: F. Bruccoleri et al, "Wide-Band CMOS Low-Noise Amplifier Exploiting Thermal Noise Canceling," IEEE Journal of Solid-State Circuits, vol. 39, No. 2, pages 275-282, February 2004. This LNA circuit has an advantage that noise and distortion products of the input stage including the noise of resistor R are substantially canceled. The noise on nodes X and Y is, however, in phase. To achieve voltage-mode noise cancellation of this noise, a source follower output stage is employed. The source of transistor $M_3$ is coupled to the output node OUT. The output impedance of the LNA is low and gain is limited.

FIG. 4 (Prior Art) is a diagram of another conventional single-ended LNA that includes a resistive feedback input stage and a source follower output stage. Circuit components 22, 23 and 24 form the resistive feedback input stage. Circuit components 25, 26 and 27 form a source follower output stage. In this case, as in the case of the circuit of FIG. 3, noise of the feedback resistor 23 is substantially canceled. The source follower output stage provides rather limited gain.

FIG. 5 (Prior Art) is a diagram of an LNA having a common-gate input stage and two common source output stages. Transistor $M_1$ and resistor $R_1$ form the input stage. Transistors $M_3$ and $M_5$ and resistor $R_L$ form the first output stage. Transistors $M_4$ and $M_5$ and resistor $R_L$ form the second output stage. This circuit has the advantage of relatively high gain and has the advantage that noise and distortion products of transistor $M_1$ of the input stage are canceled. A disadvantage, however, is that noise from resistor $R_1$ is not canceled. Moreover, the resistance of $R_1$ is limited by available voltage headroom. There is a need for a current source at the input of the common gate input amplifier, but the noise of this current source is not canceled. Moreover, a single-ended implementation of the circuit of FIG. 5 is difficult due to the current source at the input. For additional information on this LNA circuit, see: C. Liao et al., "A Broadband Noise-Canceling CMOS LNA for 3.1-10.6-GHz UWB Receivers," IEEE Journal of Solid-State Circuits, vol. 42, No. 2, pages 329-339, February 2007.

FIG. 6 (Prior Art) is a diagram of yet another conventional LNA. This LNA includes a common-gate input stage as in the case of the LNA of FIG. 5. The input stage involves circuit components 28, 29 and 30. Noise of load resistor 30 is not canceled. The LNA of FIG. 6, however, includes a complementary output stage and has an advantage of high gain. The term complementary is used to indicate that the output stage includes a P-channel transistor 31 as well as an N-channel transistor 32.

Although the conventional LNAs of FIGS. 3-6 have advantages and disadvantages as set forth above, none of these LNAs has a low noise factor of less than 2 dB, a high gain of greater than 20 dB, and an input impedance as low as approximately fifty ohms. Consequently, after considering advantages and disadvantages associated with the various known LNA circuits, a design decision is generally made to employ an undesirable and costly matching network such as the matching network 7 of FIG. 1 and FIG. 2 in order to achieve desired LNA performance.

SUMMARY

A differential Low Noise Amplifier (LNA) includes a first stage of resistive feedback amplifiers and second stage of complementary amplifiers, where the outputs of the first stage are coupled to the inputs of the second stage in a cross-coupled fashion. An inductive load (such as a transformer load) combines signals output from the complementary amplifiers of the second stage. In one example, the LNA has an input impedance of less than 75 ohms, a noise factor of less than 2 dB, and a gain of more than 20 dB. Due to the low input impedance, the LNA is usable to amplify a signal received from a source having a similar low impedance without the use of an impedance matching network between the output of the source and the input of the LNA.

In one embodiment, a differential LNA has a first LNA input node and a second LNA input node. A first resistive feedback amplifier receives a first signal from the first LNA input node and supplies an amplified version of the first signal to a first input of a second complementary amplifier. The first signal is also supplied onto a second input of a first complementary amplifier. A second resistive feedback amplifier receives a second signal from the second LNA input node and supplies an amplified version of the second signal to a first input of the first complementary amplifier. The second signal is also supplied onto a second input of the second complementary amplifier. The first and second signals on the LNA input nodes together are a differential LNA input signal. Output signals from the first and second complementary amplifiers are supplied onto two corresponding terminals of a primary winding of a transformer load. A secondary winding of the transformer load supplies a differential LNA output signal onto a pair of LNA output nodes. The differential LNA has an input impedance of less than 75 ohms, a noise factor of less than 2 dB, and a gain of more than 20 dB, when the differential LNA input signal has a frequency in a frequency range of from 100 MHz to 2.0 GHz.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 7:
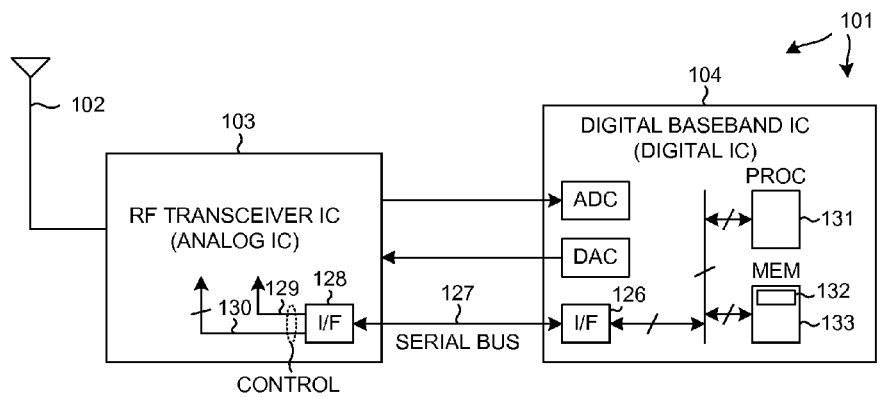
FIG. 7 is a high level block diagram of an exemplary system that includes a Low Noise Amplifier (LNA) 100 in accordance with one novel aspect.

FIG. 7 is a very simplified high level block diagram of one exemplary system that includes a Low Noise Amplifier (LNA) 100 in accordance with one novel aspect. The system is a mobile communication device 101 such as a cellular telephone. Device 101 includes (among other parts not illustrated) an antenna 102 usable for receiving and transmitting cellular telephone communications, an RF transceiver integrated circuit 103, and a digital baseband processor integrated circuit 104.

Figure 8:
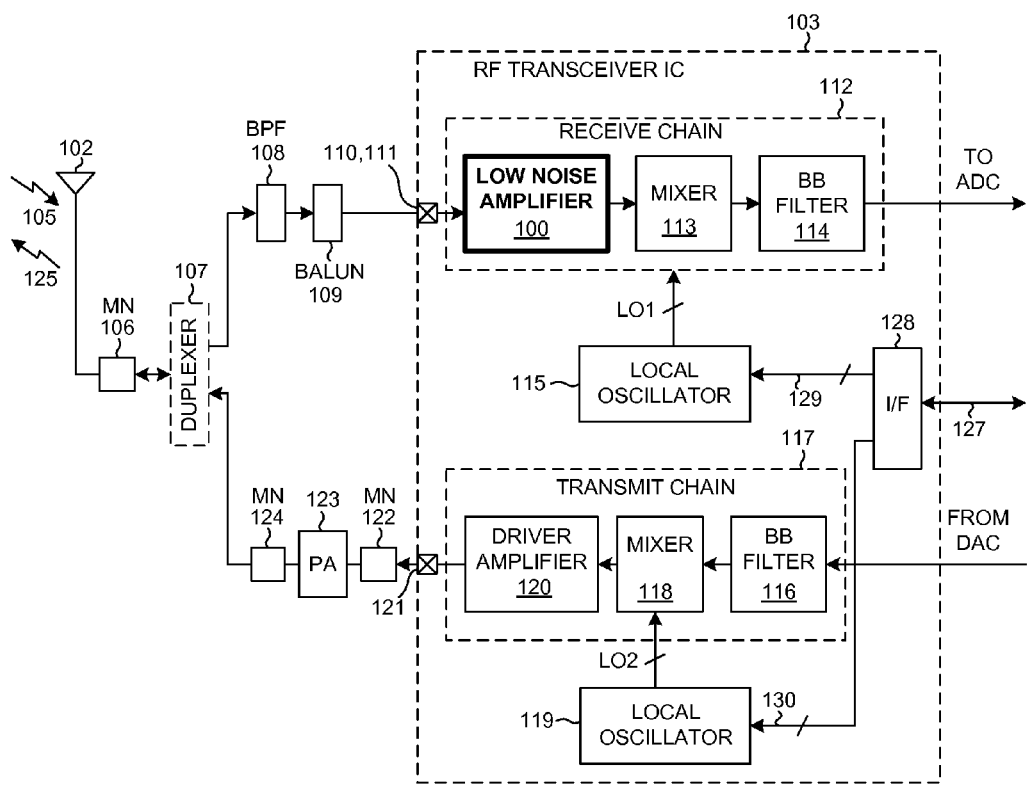
FIG. 8 is a more detailed diagram of the RF transceiver integrated circuit 103 of FIG. 7.

FIG. 8 is a more detailed diagram of the RF transceiver integrated circuit 103 of FIG. 7. In one very simplified explanation of the operation of the cellular telephone, if the cellular telephone is being used to receive information as part of a cellular telephone conversation, then an incoming transmission 105 is received on antenna 102. The incoming signal passes through a matching network 106, a duplexer 107, a bandpass filter 108, a balun 109, and into RF transceiver integrated circuit 103 via terminals 110 and 111. Alternatively, the functions of BPF 108 and balun 109 are accomplished using a SAW filter. The incoming signal is amplified by LNA 100. LNA 100 is part of a receive chain 112. After being downconverted in frequency by a quadrature mixer 113 and after being filtered by baseband filter 114, the information is communicated to the digital baseband processor integrated circuit 104 for analog-to-digital conversion and further processing in the digital domain. How the receive chain downconverts is controlled by changing the frequency of a local oscillator signal LO1 generated by local oscillator 115.

If, on the other hand, the cellular telephone 101 is being used to transmit information as part of a cellular telephone conversation, then the audio information to be transmitted is converted into analog form in digital baseband processor integrated circuit 104. The analog information is supplied to a baseband filter 116 of a transmit chain 117 of RF transceiver integrated circuit 103. After filtering, the signal is upconverted in frequency by quadrature mixer 118. The upconversion process is tuned and controlled by controlling the frequency of a local oscillator signal LO2 generated by local oscillator 119. The resulting upconverted signal is amplified by a driver amplifier 120 and is output from the RF transceiver integrated circuit 103 via terminals 121. The signal passes through a matching network 122 and is amplified by an external power amplifier 123. The amplified signal passes through another matching network 124, and duplexer 107 and matching network 106 is supplied onto antenna 102 for transmission as outgoing transmission 125. The local oscillators 115 and 119 of the receive and transmit chains are controlled by control information received via bus interface 126, serial bus 127, bus interface 128, and control conductors 129 and 130. The control information is generated by a processor 131 executing a set of processor-executable instructions 132. The instructions are stored in a processor-readable medium 133.

Figure 1:
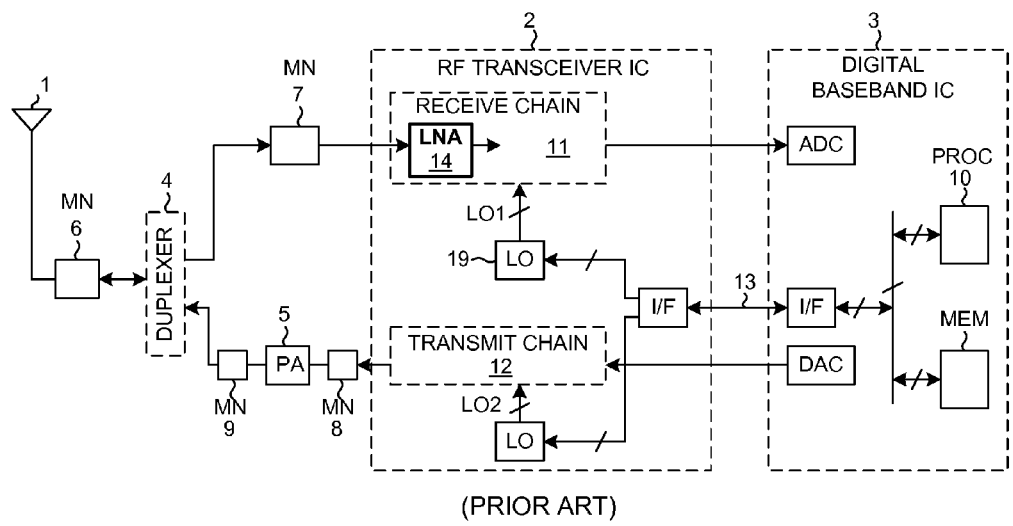
FIG. 1 (Prior Art) is a simplified block diagram of a device that employs a Low Noise Amplifier (LNA) 14.
Figure 2:
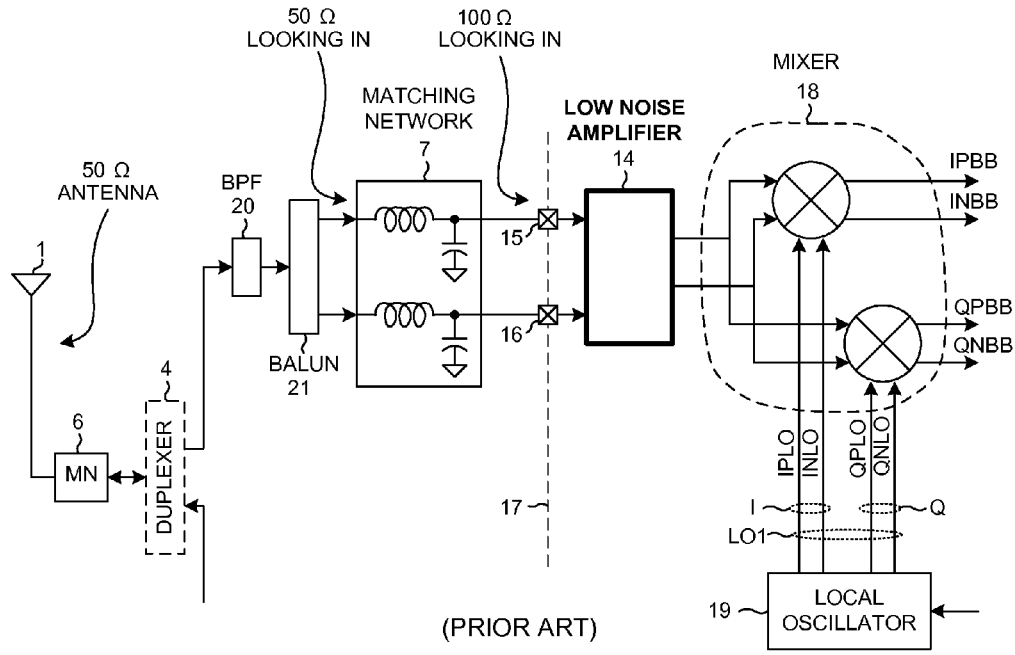
FIG. 2 (Prior Art) is a more detailed diagram of a portion of the circuit of FIG. 1 involving LNA 14 of FIG. 1.
Figure 9:
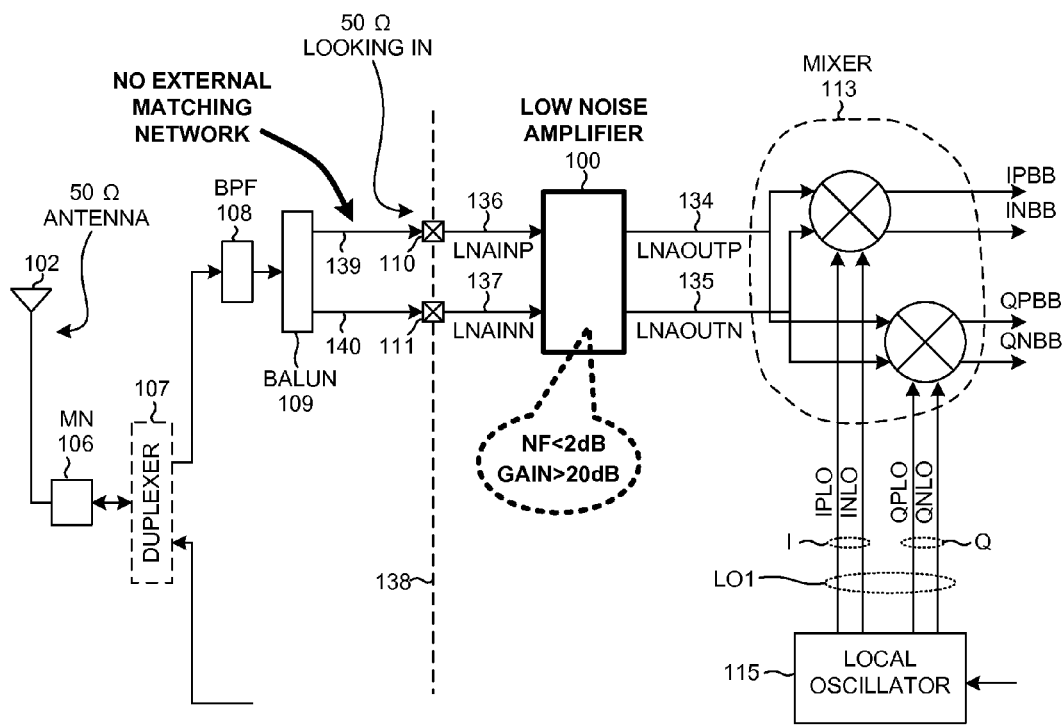
FIG. 9 is a more detailed diagram of a part of the receive signal path of the circuit of FIG. 8.

FIG. 9 is a more detailed diagram of a part of the receive signal path of the circuit of FIG. 8. Mixer 113 is a quadrature mixer and is shown in symbolic form in FIG. 9. Mixer 113 receives a differential In-phase (I) signal and a differential Quadrature (Q) signal from local oscillator 115. Mixer 113 receives a differential LNA output signal via LNA output conductors 134 and 135. This differential LNA output signal involves the signal LNAOUTP on conductor 134 and the signal LNAOUTN on conductor 135. LNA 100 receives a differential LNA input signal via LNA input conductors 136 and 137. This differential LNA input signal involves the signal LNAINP on conductor 136 and terminal 110 and also involves the signal LNAINN on conductor 137 and terminal 111. Dashed line 138 represents the boundary of the RF integrated circuit 103. Terminals 110 and 111 may, for example, be terminals of an integrated circuit package that houses RF transceiver integrated circuit 103. Terminals 110 and 111 may, for example, be microbumps or bond pads of RF transceiver integrated circuit 103. The input impedance looking into RF transceiver integrated circuit 103 through terminals 110 and 111 and conductors 136 and 137 is approximately 50 ohms and is less than 75 ohms. A first ESD protection circuit 186 also loads conductor 136 with 50 fF of capacitance. Conductors 139 and 140 are conductors such as traces on a printed circuit board extending from balun 109 to the RF transceiver integrated circuit 103. Conductor 139, terminal 110, and conductor 136 together form a first input node. A second ESD protection circuit 187 also loads conductor 137 with 50 fF of capacitance. Conductor 140, terminal 111, and conductor 137 together form a second input node. In the illustrated embodiment, there is no matching network between balun 109 and the terminals 110 and 111 of the RF transceiver integrated circuit 103. Manufacturing costs associated with having to provide an impedance matching network, such as impedance matching network 7 of FIG. 1 and FIG. 2, between the balun and the RF transceiver integrated circuit are therefore avoided.

Figure 10:
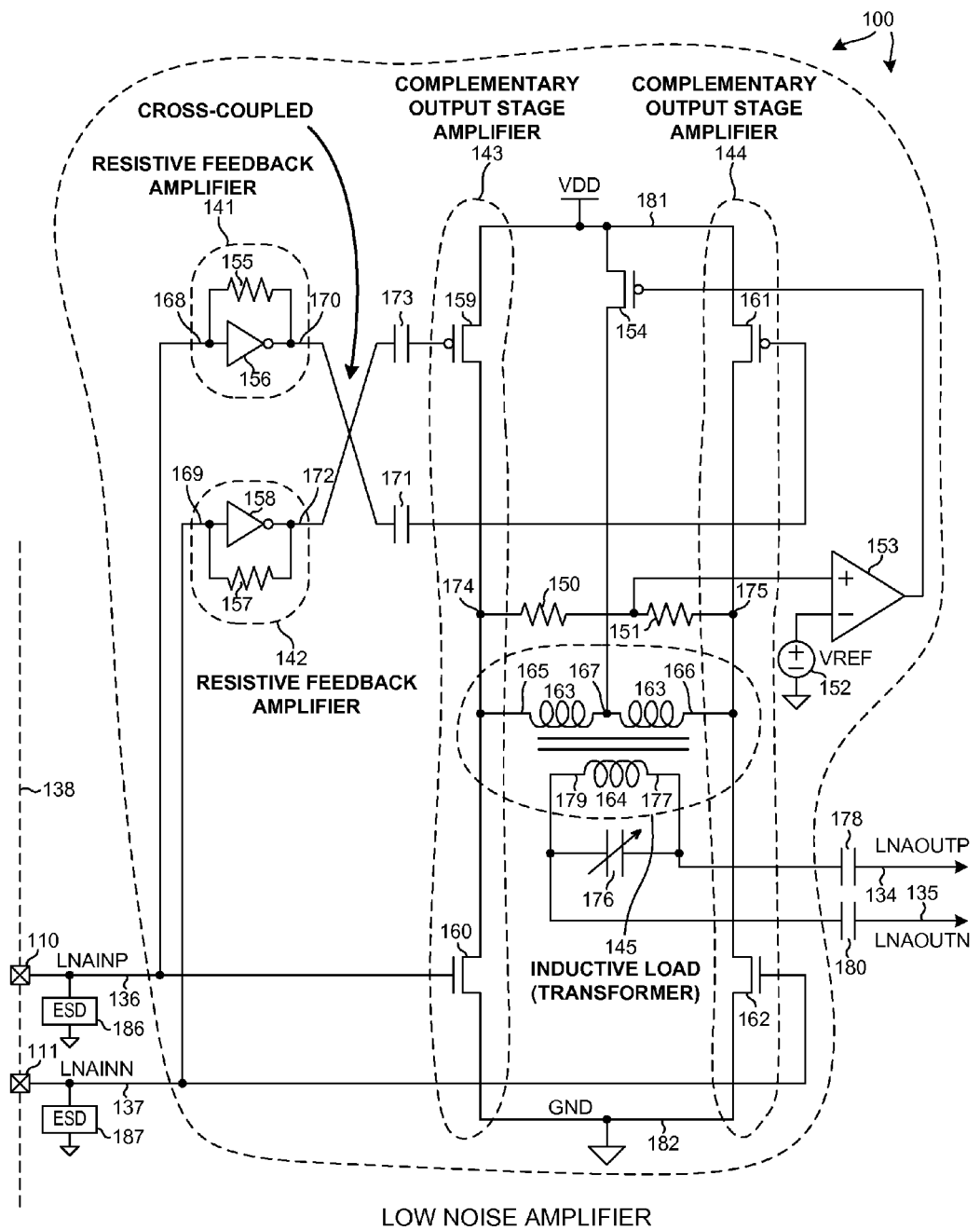
FIG. 10 is a more detailed diagram of LNA 100 of FIG. 9.

FIG. 10 is a more detailed diagram of LNA 100 of FIG. 9. LNA 100 includes a first resistive feedback inverting amplifier 141, a second resistive feedback inverting amplifier 142, a first complementary output stage amplifier 143, a second complementary output stage amplifier 144, an inductive load 145, and a biasing circuit. The biasing circuit includes resistors 150 and 151, reference voltage source 152 of magnitude VREF, operational amplifier 153, and P-channel transistor 154. The biasing circuit sets a common mode voltage of a differential output signal present between nodes 174 and 175. The magnitude of VREF is set or is adjusted to optimize the linearity performance of the LNA.

First feedback inverting amplifier 141 includes a feedback resistance 155 and an amplifier 156. Second feedback inverting amplifier 142 includes a feedback resistance 157 and an amplifier 158. Inverting amplifiers 156 and 158 need not be implemented as complementary logic gate inverters (involving a P-channel pullup and an N-channel pulldown) but rather may be implemented in numerous ways. The inverter symbol is intended to be general representation of an inverting amplifier.

First complementary output stage amplifier 143 includes a P-channel field effect transistor 159 and an N-channel field effect transistor 160. Similarly, second complementary output stage amplifier 144 includes a P-channel field effect transistor 161 and an N-channel field effect transistor 162. Inductive load 145 in this example is a tuned transformer load and includes a first winding 163 and a second winding 164. First winding 163 has a first terminal 165, a second terminal 166, and a center tap terminal 167. First winding 163 may, for example, be an integrated spiral metal inductor realized in upper layers of metallization and interlayer vias so that winding 163 has two to four turns and has an inductance of about 2 nH. The biasing circuit is connected to center tap terminal 167 of winding 163 via P-channel transistor 154. An input 168 of the first resistive feedback amplifier 141 is coupled to conductor 136, to terminal 110, and to the gate of N-channel transistor 160 of the first complementary output stage amplifier 143. An input 169 of the second resistive feedback amplifier 142 is coupled to conductor 137, to terminal 111, and to the gate of N-channel transistor 162 of the second complementary output stage amplifier 144. The output 170 of the first resistive feedback amplifier 141 is capacitively coupled via capacitance 171 to the gate of the P-channel transistor of the second complementary output stage amplifier 144. The output 172 of the second resistive feedback amplifier 142 is capacitively coupled via capacitance 173 to the gate of the P-channel transistor of the first complementary output stage amplifier 143. The gate of P-channel transistor 159 is a first input to first complementary output stage amplifier 143 and the gate of N-channel transistor 160 is a second input to first complementary output stage amplifier 143 and node 174 at the drains of transistors 159 and 160 is the output first complementary output stage amplifier 143. The gate of P-channel transistor 161 is a first input to second complementary output stage amplifier 144 and the gate of N-channel transistor 162 is a second input to second complementary output stage amplifier 144 and node 175 at the drains of transistors 161 and 162 is the output of second complementary output stage amplifier 144. The second winding 164 of transformer load 145 is tuned by capacitor 176. Terminal 177 on second winding 164 is capacitively coupled via capacitance 178 to output conductor 134. Terminal 179 on second winding 164 is capacitively coupled via capacitance 180 to output conductor 135. Conductor 181 is a supply voltage conductor VDD. Conductor 182 is a ground conductor GND.

Figure 6:
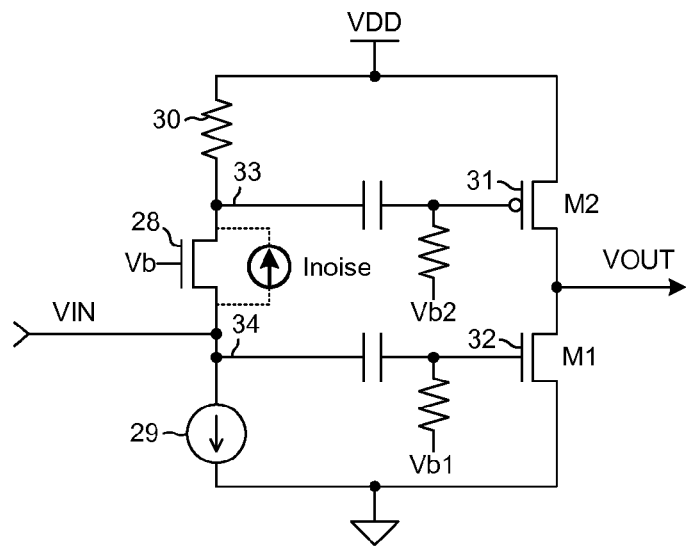
FIG. 6 (Prior Art) is a diagram of conventional LNA having a common-gate input stage and a complementary output stage.
Figures 11, 12:
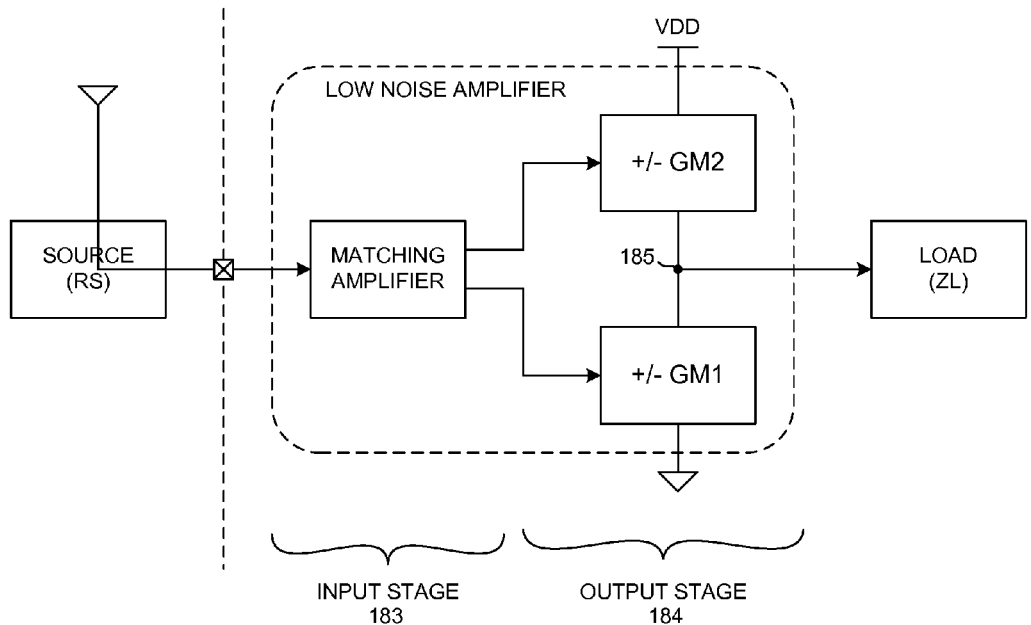
FIG. 11 is a diagram that represents a simplification of the composition of the conventional LNAs of FIG. 3-6 and of the LNA 100 of FIG. 10.
FIG. 12 is a table that sets forth characteristics of TYPE#1 LNAs, TYPE#2 LNAs, and of the LNA 100 of FIG. 10.

FIG. 11 is a diagram that represents a simplification of the composition of the conventional LNAs of FIG. 3-6 and of the LNA 100 of FIG. 10. As illustrated in FIG. 11, the LNAs have an input stage 183, also referred to as a matching amplifier, as well as an output stage 184. The outputs of the amplifiers of the second stage are added together as represented by node 185. It is recognized that the conventional LNAs of FIGS. 3-6 can be classified into two general types. In the first type of LNA, designated TYPE#1 here, the input stage is a common-gate amplifier. The LNA of FIG. 6 is an example of such an LNA. Voltage noise on one of the output nodes 33 of the first stage is out of phase with respect to voltage noise on the other of the output nodes 34 of the first stage. A complementary output stage can be used to add such signals, thereby effectively canceling out of phase components of the signals. In the case where the voltage noise on nodes 33 and 34 is out of phase, this noise is canceled by the complementary output stage and does not pass to the output of the LNA. LNAs of this type can have a high voltage gain due to the output impedance of the output stage being high. Noise of the load resistance 30 of the input stage going into the output stage is, however, not out of phase. Noise on nodes 33 and 34 due to load resistance 30 therefore passes through the output stage without being canceled. Consequently the noise factor of this type of LNA is generally comparatively poor. Characteristics of such TYPE#1 LNAs are represented in simplified and generalized form in the upper row of the table of FIG. 12 labeled TYPE#1 LNA. The column labeled NOISE FACTOR contains an entry of "BAD" in the first row corresponding to TYPE#1 LNAs. This "BAD" noise factor is given in relative terms to the noise factor of other LNAs as explained below.

Figure 3:
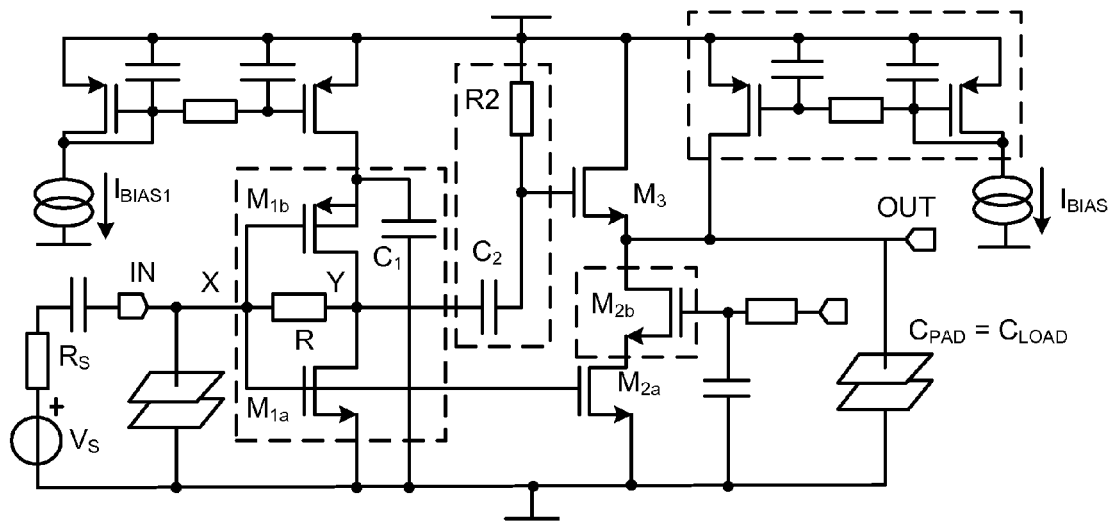
FIG. 3 (Prior Art) is a diagram of a first conventional LNA having a resistive feedback amplifier based input stage and a source follower based output stage.
Figure 4:
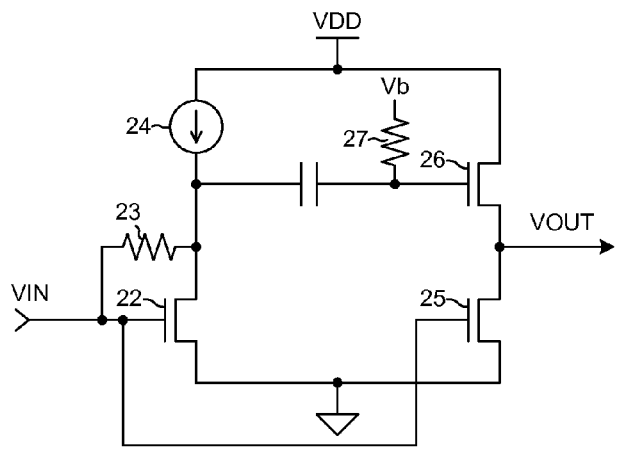
FIG. 4 (Prior Art) is a diagram of a second conventional LNA having a resistive feedback amplifier based input stage and a source follower based output stage.
Figure 5:
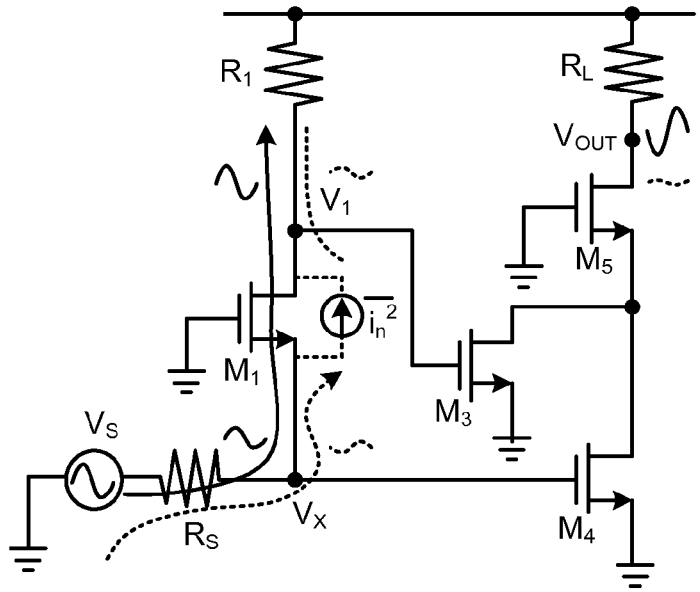
FIG. 5 (Prior Art) is a diagram of a conventional LNA having a common-gate input stage and two common source output stages.

In the second type of LNA, designated TYPE#2 here, the input stage involves a resistive feedback amplifier. The LNA of FIG. 3 is an example of such an LNA. Noise due to resistance R of the input stage is in phase on the output nodes X and Y of the first stage. The output stage of the LNA is, however, of a type that subtracts common mode signals on the outputs of the first stage. Resistor noise on node X is therefore effectively subtracted from resistor noise on node Y. As indicated in the second row of FIG. 12, noise factor of TYPE#2 LNAs is generally comparatively good. Gain, however, of this TYPE#2 LNA is comparatively bad. In the LNA of FIG. 3, for example, gain is low because the impedance looking into the LNA through node OUT is low. The output impedance is low because the source of a transistor, N-channel transistor $M_3$, is coupled to node OUT.

In one novel aspect, the table of FIG. 12 is created and studied. It is recognized that the best choice for the input stage in a two stage LNA is a resistive feedback amplifier because a resistive feedback amplifier gives the best noise factor. It is further recognized that the best choice for the output stage is a complementary amplifier because a complementary amplifier gives the best gain due to the fact that no transistor source is coupled to the output node. However, if a resistive feedback amplifier is used as the input stage then the noise signals on the output nodes of the first stage will be in phase to one another. In order to use a complementary amplifier for the second stage, the noise signals as supplied to the two inputs of the complementary output stage should be out of phase. Accordingly, if the two signals as output from the first stage could be inverted, then the noise signals as supplied to the complementary amplifier second stage would be out of phase as required for the complementary amplifier to cancel that noise. In is further recognized that one way to invert a differential signal is to interchange (i.e. to cross or to swap) the two signals making up the differential signal. Accordingly, a first stage involving two resistive feedback amplifiers is provided as a first differential stage. The outputs of this first stage are crossed going into a second stage involving two complementary amplifiers. The signals as output from the two complementary amplifiers are summed using a transformer load so that the two complementary amplifiers form a second stage of the LNA that is a differential stage. Crossing the signals as output from the first stage before the signals pass into the second stage inverts the noise of the first stage, thereby making the noise out of phase, and thereby allowing the complementary output stage to cancel that noise.

The above description is a substantially simplified explanation of the operation of the LNA 100. It is presented above for illustrative and instructional purposes. A more accurate explanation involves recognizing that the two noise signals as output from the two resistive feedback amplifiers of a first stage could appear as common-mode if those noise signals were perfectly correlated and had equal magnitudes. If the two noise signals were common-mode, and if such noise signals were supplied as inputs to the two inputs of differential amplifier (such as a second stage involving two complementary amplifiers), then such common-mode noise would not pass through the differential stage. A differential amplifier by its very nature only amplifies differential signals. Common mode signals on the two inputs of a differential amplifier would not pass through the amplifier. If, however, resistive feedback amplifiers were employed in the first stage without their outputs being crossed, then noise as output from these two resistive feedback amplifiers would not be correlated. By crossing the differential outputs from the first stage, uncorrelated noise voltage from the outputs of the two resistive feedback amplifiers is added in the second stage. As a result of this adding, the noise currents in the two branches of the output stage (going into the transformer load) are correlated. The magnitudes of these two correlated noise currents can be made equal by selecting the proper ratio of N-channel gm to P-channel gm in the complementary amplifiers. When this is done, noise from the first stage appears as common mode at the output of the second stage, and this common mode noise is attenuated by the transformer load.

This more accurate explanation is still a simplification of a set of complex interactions and mechanisms. Regardless of details of the precise interactions and mechanisms at work, LNA 100 as predicted is observed to have superior performance as compared to TYPE#1 LNAs and TYPE#2 LNAs in that LNA 100 has an input impedance of less than 75 ohms, a noise factor of less than 2 dB, and a gain of more than 20 dB, for operation over a wide frequency operating range from 500 MHz to 2 GHz. Due to LNA 100 achieving both high gain and low noise factor while having a low input impedance, no matching network is needed between the terminals 110 and 111 of RF transceiver integrated circuit 103 and balun 109. None of the TYPE#1 or TYPE#2 LNAs can simultaneously meet all three of these performance parameters.

Figure 13:
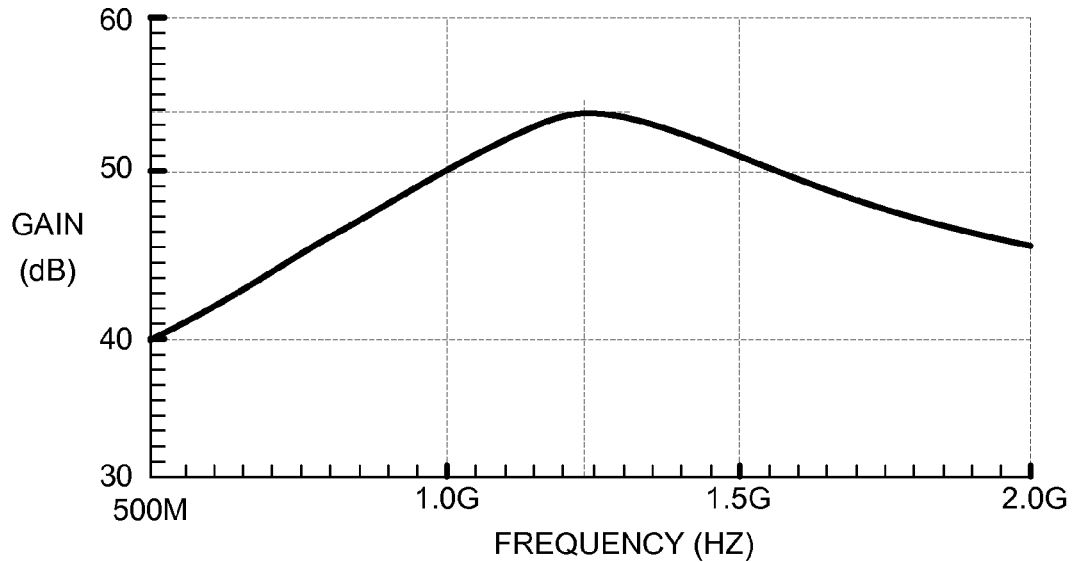
FIG. 13 is a graph that shows the gain of the LNA 100 of FIG. 10 over an operating frequency range of from 500 MHz to 2.0 GHz.
Figure 14:
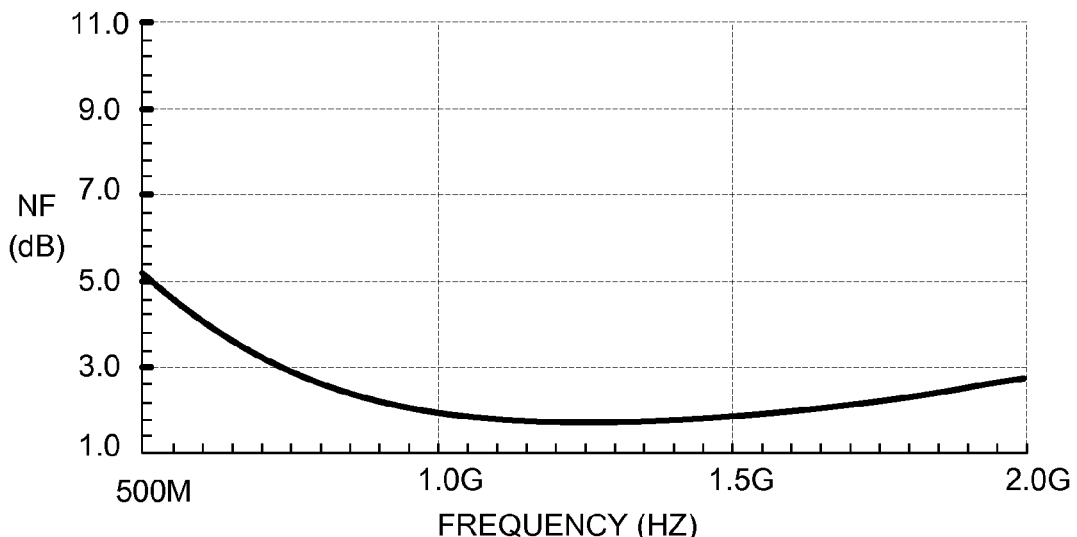
FIG. 14 is a graph that shows the noise factor (NF) of the LNA 100 of FIG. 10 over an operating frequency range of from 500 MHz to 2.0 GHz.
Figure 15:
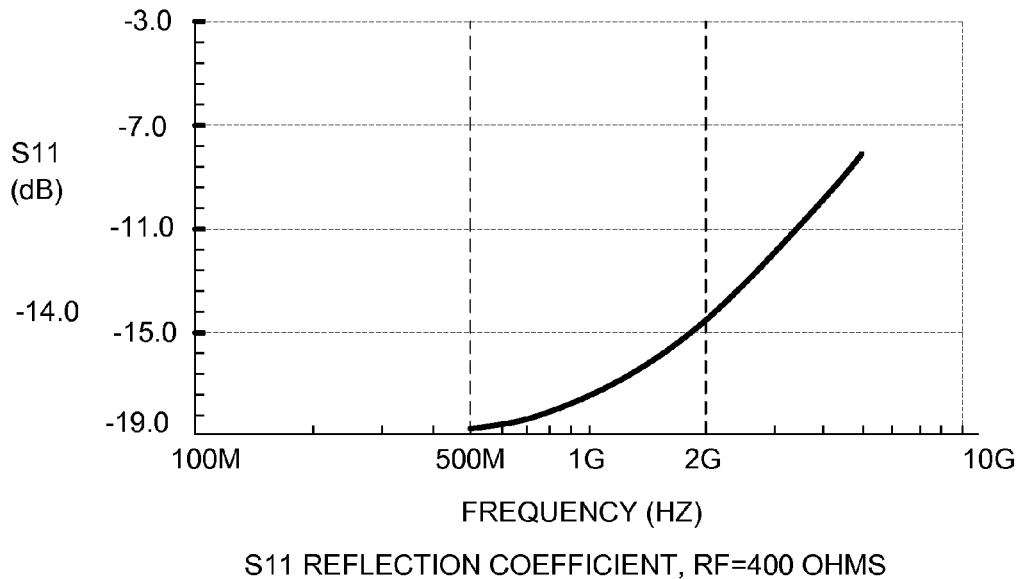
FIG. 15 is a graph that shows the S11 reflection coefficient looking into the LNA 100 of FIG. 10 over an operating frequency range of from 500 MHz to 2.0 GHz.

FIG. 13 is a graph that shows the gain of LNA 100 of FIG. 10 over an operational frequency range of from 500 MHz to 2.0 GHz. As illustrated, for a feedback resistance RF of 400 ohms, the gain exceeds 40 dB over this entire operational frequency range. FIG. 14 is a graph that shows the Noise Factor (NF) of LNA 100 of FIG. 10 over this same operational frequency range of from 500 MHz to 2.0 GHz. As illustrated, for a feedback resistance RF of 400 ohms, the noise factor is less than 5 dB over this entire operational frequency range. FIG. 15 is a graph that shows the S11 reflection coefficient over this same operational frequency range of 500 MHz to 2 GHz. This S11 reflection coefficient is a measure of the amount of reflected power looking into LNA 100 from a fifty ohm source. Accordingly, the S11 reflection coefficient is also a measure of how well the input impedance of LNA 100 matches the fifty ohm source. As illustrated, the reflection coefficient is less than −14 dB over the entire 500 MHz to 2 GHz frequency range. This S11 reflection coefficient corresponds to an input impedance of less than seventy-five ohms over the entire 500 MHz to 2 GHz operating frequency range. The graphs of FIGS. 13-16 represent operation of LNA 100 at a current consumption of approximately 15 mA.

There is a relationship between the noise factor of LNA 100 and the input impedance of LNA 100. Noise factor can be reduced at the expense of increasing the input impedance of LNA 100 so that LNA is less well impedance matched to a fifty ohm source. Similarly, the input impedance of LNA 100 can be reduced to better match a fifty ohm source at the expense of increasing noise factor. How the tradeoff between noise factor and matching input impedance is made depends on the particular application. Moreover, bandwidth of LNA 100 can be tuned by changing the capacitance of capacitor 176. In some embodiments, capacitor 176 is a variable capacitor whose capacitance is controlled by a digital control value.

Figure 16:
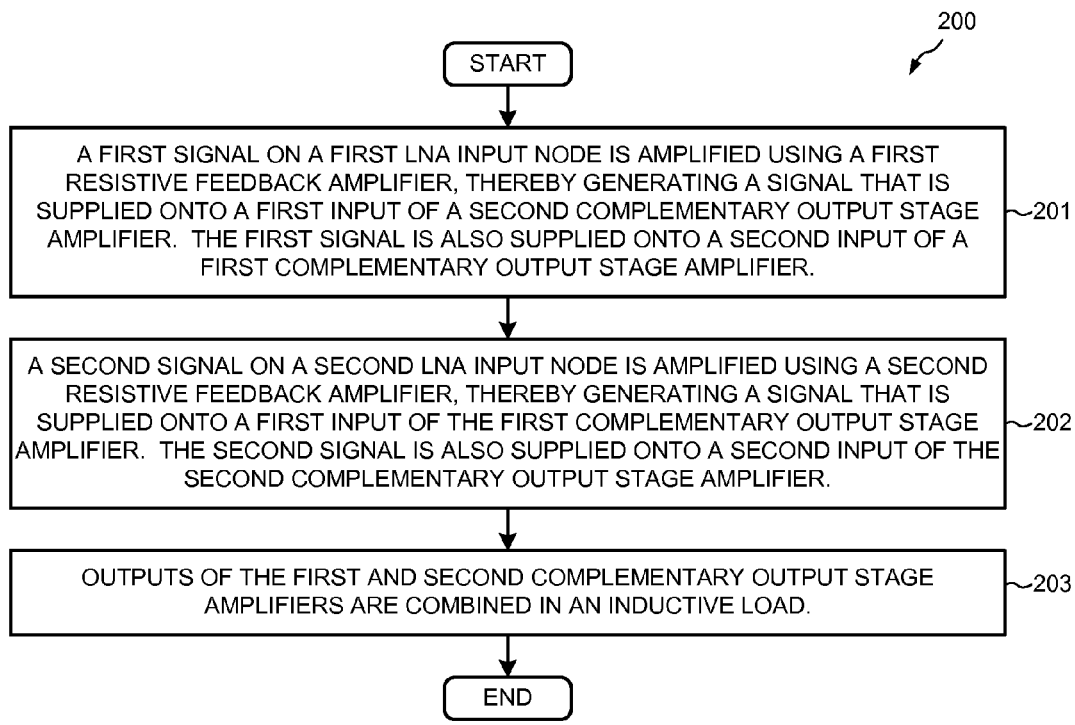
FIG. 16 is a flowchart of a method 200 in accordance with one novel aspect.

FIG. 16 is a simplified flowchart of a method 200. In step 201, a first signal on a first LNA input node is amplified using a first resistive feedback inverting amplifier, thereby generating a signal that is supplied onto a first input of a second complementary output stage amplifier. The first signal is also supplied onto a second input of a first complementary output stage amplifier.

In a step 202, a second signal on a second LNA input node is amplified using a second resistive feedback inverting amplifier, thereby generating a signal that is supplied onto a first input of the first complementary output stage amplifier. The second signal is also supplied onto a second input of the second complementary output stage amplifier.

In a step 203, a signal output by the first complementary output stage amplifier and a signal output by the second complementary output stage amplifier are combined in an inductive load. In one example, the first and second signals on the first and second LNA input nodes together are a differential LNA input signal. The inductive load is a transformer load having a primary winding and a secondary winding. A differential LNA output signal is output from a pair of terminals of the secondary winding via AC coupling capacitors onto a corresponding pair of LNA output conductors.

Although certain specific embodiments are described above for instructional purposes, the teachings of this patent document have general applicability and are not limited to the specific embodiments described above. In multi-mode systems involving multiple receive chains, employing the circuits and techniques described above to avoid using an external matching network for each of the receive chains has especially high utility and can result in considerable cost savings. The inductive load need not be a transformer, but rather may be a center-tapped inductor connected as the first winding 163 of the transformer of FIG. 10 except that there is no second winding and capacitor 176 is coupled between nodes 175 and 174 such that node 175 is capacitively coupled by capacitor 178 to output conductor 134 and such that node 174 is capacitively coupled by capacitor 180 to output conductor 135. Accordingly, various modifications, adaptations, and combinations of the various features of the described specific embodiments can be practiced without departing from the scope of the claims that are set forth below.

What is claimed is:

1. A circuit comprising:
   a first input conductor;
   a second input conductor;
   an inductive load having a first winding, wherein the first winding has a first terminal and a second terminal;
   a first resistive feedback inverting amplifier having an input coupled to the first input conductor;
   a second resistive feedback inverting amplifier having an input coupled to the second input conductor;
   a first complementary output stage including a P-channel transistor and an N-channel transistor, wherein a gate of the P-channel transistor of the first complementary output stage is coupled to an output of the second resistive feedback inverting amplifier, wherein a gate of the N-channel transistor of the first complementary output stage is coupled to the first input conductor, and wherein the first complementary output stage has an output that is coupled to the first terminal of the first winding of the inductive load; and
   a second complementary output stage including a P-channel transistor and an N-channel transistor, wherein a gate of the P-channel transistor of the second complementary output stage is coupled to an output of the first resistive feedback inverting amplifier, wherein a gate of the N-channel transistor of the second complementary output stage is coupled to the second input conductor, and wherein the second complementary output stage has an output coupled to the second terminal of the first winding of the inductive load.

2. The circuit of claim 1, wherein the input of the first resistive feedback inverting amplifier and a gate of the N-channel transistor of the first complementary output stage and the first input conductor all form a first input node, wherein the input of the second resistive feedback inverting amplifier and a gate of the N-channel transistor of the second complementary output stage and the second input conductor all form a second input node, wherein the output of the first resistive feedback inverting amplifier is capacitively coupled to the gate of the P-channel transistor of the second complementary output stage, and wherein the output of the second resistive feedback inverting amplifier is capacitively coupled to the gate of the P-channel transistor of the first complementary output stage.

3. The circuit of claim 1, further comprising:
   a first output conductor, wherein the inductive load is a transformer load and further comprises a second winding, wherein the second winding has a first terminal and a second terminal, and wherein the first output conductor is coupled to the first terminal of the second winding of the inductive load; and
   a second output conductor that is coupled to the second terminal of the second winding of the inductive load.

4. The circuit of claim 3, wherein the first terminal of the second winding of the inductive load is capacitively coupled to the first output conductor, and wherein the second terminal of the second winding of the inductive load is capacitively coupled to the second output conductor.

5. The circuit of claim 3, further comprising:
   a biasing circuit that sets a common mode voltage of a differential output signal present between the first and second output conductors.

6. The circuit of claim 1, further comprising:
   a biasing circuit having a first input, a second input, and an output, wherein the first input of the biasing circuit is coupled to the output of the first complementary output stage, wherein the second input of the biasing circuit is coupled to the output of the second complementary output stage, and wherein the output of the biasing circuit is coupled to a third terminal of the first winding of the inductive load.

7. The circuit of claim 1, wherein the circuit has an input impedance of less than 75 ohms looking into the circuit through the first and second input conductors.

8. The circuit of claim 7, wherein the circuit is an amplifier having a noise factor of no more than approximately 2 dB, and having a gain of at least approximately 20 dB.

9. The circuit of claim 1, wherein the circuit is an integrated circuit, and wherein the first and second input conductors are terminals of the integrated circuit.

10. A Low Noise Amplifier (LNA) comprising:
    a first stage comprising a first resistive feedback amplifier and a second resistive feedback amplifier; and
    a second stage comprising a first complementary amplifier and a second complementary amplifier, wherein a first input of the first complementary amplifier is coupled to receive a signal from the second resistive feedback amplifier, and wherein a first input of the second complementary amplifier is coupled to receive a signal from the first resistive feedback amplifier, an output of the first complementary amplifier configured to be combined with an output of the second complementary amplifier.

11. The LNA of claim 10, wherein a second input of the first complementary amplifier is coupled to an input of the first resistive feedback amplifier, and wherein a second input of the second complementary amplifier is coupled to an input of the second resistive feedback amplifier.

12. The LNA of claim 11, further comprising:
    an inductive load, wherein an output of the first complementary amplifier is coupled to a first terminal of the inductive load, and wherein an output of the second complementary amplifier is coupled to a second terminal of the inductive load.

13. The LNA of claim 12, wherein the first complementary amplifier comprises a P-channel transistor and an N-channel transistor, wherein a drain of the P-channel transistor is coupled to a drain of the N-channel transistor and to the first terminal of the inductive load, wherein a gate of the P-channel transistor is the first input of the first complementary amplifier, and wherein a gate of the N-channel transistor is the second input of the first complementary amplifier.

14. The LNA of claim 10, further comprising:
a first input conductor, wherein the first resistive feedback amplifier is coupled to receive a first signal from the first input conductor; and
a second input conductor, wherein the second resistive feedback amplifier is coupled to receive a second signal from the second input conductor, wherein the first and second signals together are a differential input signal to the LNA.

15. A method comprising:
amplifying a signal on a first input node using a first resistive feedback amplifier and thereby generating a signal that is driven onto a first input of a second complementary output stage;
amplifying a signal on a second input node using a second resistive feedback amplifier and thereby generating a signal that is driven onto a first input of a first complementary output stage; and
combining a signal output by the first complementary output stage and a signal output by the second complementary output stage in an inductive load.

16. The method of claim 15, further comprising:
supplying the signal on the first input node onto a second input of the first complementary output stage; and
supplying the signal on the second input node onto a second input of the second complementary output stage.

17. A method comprising:
providing a first resistive feedback amplifier having an input coupled to a first input node;
providing a second resistive feedback amplifier having an input coupled to a second input node;
providing a first complementary output stage having a first input coupled to an output of the second resistive feedback amplifier, and having a second input coupled the first input node;
providing a second complementary output stage having a first input coupled to an output of the first resistive feedback amplifier, and having a second input coupled the second input node; and
providing an inductive load coupled to the first and second complementary output stages.

18. A circuit comprising:
a pair of differential input nodes; and
means for receiving a differential signal from the pair of differential input nodes, for cancelling noise from a first noise signal of the differential signal with noise from a second noise signal of the differential signal, and for amplifying the differential signal such that an input impedance looking into the circuit through the pair of differential input nodes is less than 75 ohms, and such that the means has a noise factor of no more than 2 dB, and such that the means amplifies the differential signal with a gain of at least 20 dB.

19. The circuit of claim 18, wherein the circuit is an integrated circuit, wherein the pair of differential input nodes is a pair of differential input terminals of the integrated circuit, and wherein the means is a Low Noise Amplifier (LNA).

20. The circuit of claim 18, wherein the means comprises:
a first stage comprising a pair of resistive feedback amplifiers;
a second stage comprising a pair of complementary amplifiers; and
an inductive load.

21. The circuit of claim 18, wherein the circuit is a part of a cellular telephone.

* * * * *